United States Patent
Sawasaki et al.

(10) Patent No.: US 7,425,738 B2
(45) Date of Patent: Sep. 16, 2008

(54) METAL THIN FILM AND METHOD OF MANUFACTURING THE SAME, DIELECTRIC CAPACITOR AND METHOD OF MANUFACTURING THE SAME, AND SEMICONDUCTOR DEVICE

(75) Inventors: Tatsuo Sawasaki, Fujimi-cho (JP); Kenichi Kurokawa, Suwa (JP); Teruo Tagawa, Suwa (JP); Kenichi Tsuchiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 351 days.

(21) Appl. No.: 11/105,368

(22) Filed: Apr. 14, 2005

(65) Prior Publication Data

US 2005/0230731 A1 Oct. 20, 2005

(30) Foreign Application Priority Data

| Apr. 15, 2004 | (JP) | ............... 2004-120331 |
| Feb. 24, 2005 | (JP) | ............... 2005-048820 |

(51) Int. Cl.
*H01L 27/108* (2006.01)

(52) U.S. Cl. .................................................. 257/296

(58) Field of Classification Search ......... 257/295–300, 257/59, 359
See application file for complete search history.

(56) References Cited

U.S. PATENT DOCUMENTS 6,025,205 A 2/2000 Park et al.

FOREIGN PATENT DOCUMENTS

| CN | A-1306387 | 8/2001 |
| EP | 0 855 738 A2 | 7/1998 |
| EP | 1 160 870 A2 | 12/2001 |
| JP | A 2002-208679 | 7/2002 |
| JP | A-2003-218227 | 7/2003 |

OTHER PUBLICATIONS

M. Vellaikal et al., "Microstructural Characterization of Platinum Films Grown by MOCVD", Mat. Res. Soc. Symp. Proc., vol. 403, (1996) pp. 27-32.
H. N. Al-Shareef et al., "Electrodes for Ferroelectric Thin Films", Integrated Ferroelectrics, vol. 3, (1993) pp. 321-332.
Oh, "Conditions of Heat Treatment and Deposition and Magnetic Characteristics of Co-Pt Thin Film for Magnetic Recording," Master's Dissertation, Korea Advanced Institute of Science and Technology, Dec. 23, 1998.
Jung, "Pt Hillock Formation Mechanism of Pt/Ti Electrode for Ferroelectric Random Access Memory (FRAM)," Master's Dissertation, Korea Advanced Institute of Science and Technology, 2002.

*Primary Examiner*—Nathan W Ha
(74) *Attorney, Agent, or Firm*—Oliff & Berridge, PLC

(57) ABSTRACT

A metal thin film provided on a substrate and having a metal with a face-centered cubic crystal structure, wherein the metal thin film is preferentially oriented in a (111) plane, and a (100) plane which is not parallel to a surface of the substrate is present on a surface of the thin film. In this metal thin film, the metal with a face-centered cubic crystal structure includes at least one element selected from the group consisting of Pt, Ir, and Ru.

4 Claims, 13 Drawing Sheets

METAL THIN FILM AND METHOD OF MANUFACTURING THE SAME, DIELECTRIC CAPACITOR AND METHOD OF MANUFACTURING THE SAME, AND SEMICONDUCTOR DEVICE

Japanese Patent Application No. 2004-120331, filed on Apr. 15, 2004 and Japanese Patent Application No. 2005-048820, filed on Feb. 24, 2005, are hereby incorporated by reference in their entirety.

BACKGROUND OF THE INVENTION

The present invention relates to a metal thin film and a method of manufacturing the metal thin film, a dielectric capacitor and a method of manufacturing the dielectric capacitor, and a semiconductor device.

In recent years, accompanying advances in thin-film formation technology, a reduction in the size and an increase in the degree of integration of devices have been attempted by applying high-dielectric-constant characteristics of oxide dielectric thin-film materials to capacitors of semiconductor memories such as a DRAM. The degree of integration can be increased by applying ferroelectric characteristics to capacitors, and development of novel devices such as a ferroelectric memory (hereinafter indicated as "FeRAM") which operates at high speed has progressed.

Since the FeRAM utilizes high-speed polarization reversal and remanent polarization of a ferroelectric thin film, the FeRAM has features such as high-speed write capability, nonvolatility, and low power consumption. Therefore, the FeRAM has attracted attention as the new next-generation memory. In the FeRAM, the remanent polarization direction of the ferroelectric capacitor is written by applying a voltage. Therefore, the FeRAM has an advantage in that the write speed is 1000 times or more and power consumption is $\frac{1}{10}$ or less in comparison with an EEPROM in which data is written by injection of electrons by applying a high voltage to a tunnel oxide film.

The ferroelectric capacitor is generally formed by two electrode films and a ferroelectric film interposed between the electrode films. As the ferroelectric material, complex oxides such as a Pb-containing perovskite ferroelectric $Pb(Zr,Ti)O_3$ (hereinafter may be called "PZT") and a Bi-layer structured ferroelectric $SrBi_2Ta_2O_9$ are well known. As the electrode film of the ferroelectric capacitor, noble metals such as Pt, Ir, and Ru or oxides of these metals are used due to their high thermal stability.

As the formation method for the ferroelectric film, a physical vapor deposition (PVD) method, a chemical vapor deposition (CVD) method, a solution coating method, and the like are generally utilized. As the formation method for the electrode film, a physical vapor deposition (PVD) method and a chemical vapor deposition (CVD) method are generally used.

In order to improve the performance and increase the degree of integration of the FeRAM, the ferroelectric capacitor is required to have a small size, low polarization-reversal voltage, large remanent polarization, small leakage current, and excellent fatigue resistance. In order to achieve this objective, various improvements have been made on the capacitor structure and the manufacturing method.

However, in spite of high material potential and long development history of the ferroelectric material, the FeRAM has been put on the market only as a product with a small degree of integration, that is, as a product with a large capacitor size. This is because characteristics such as the remanent polarization, leakage current, and fatigue resistance significantly deteriorate as the size of the ferroelectric capacitor is decreased.

As the reasons for deterioration of the capacitor characteristics accompanying a decrease in size, vaporization and diffusion of the capacitor material occurring during heat treatment, damage to the crystal occurring during capacitor etching, reduction of the ferroelectric film due to hydrogen produced during formation of an interlayer dielectric or a tungsten film, and the like can be given. In particular, deterioration of the capacitor characteristics due to hydrogen is a problem specific to the FeRAM manufacturing steps, and various techniques have been examined in order to solve this problem. These effects significantly decrease the remanent polarization of the capacitor from the initial value. Therefore, in order to realize a highly integrated FeRAM, development of process technology which prevents the effects of the process damage is indispensable.

In addition to preventing the process damage, it is effective to increase the remanent polarization of the capacitor in order to realize an increase in the degree of integration of the FeRAM. In order to increase the remanent polarization, it is necessary to sufficiently increase the crystallinity and the degree of crystal orientation of the ferroelectric film of the capacitor, for example.

SUMMARY

According to a first aspect of the present invention, there is provided a metal thin film provided on a substrate and having a metal with a face-centered cubic crystal structure, wherein the metal thin film is preferentially oriented in a (111) plane; and wherein a (100) plane which is not parallel to a surface of the substrate is present on a surface of the thin film.

According to a second aspect of the present invention, there is provided a method of manufacturing a metal thin film using physical vapor deposition, the method comprising:

depositing the metal thin film by applying a voltage of 400 V or less.

According to a third aspect of the present invention, there is provided a method of manufacturing a metal thin film using physical vapor deposition, wherein a deposition rate is equal to or more than 0.5 Å/sec, but does not exceed 5 Å/sec.

According to a fourth aspect of the present invention, there is provided a method of manufacturing a metal thin film using physical vapor deposition, wherein a degree of vacuum during deposition is equal to or more than 0.8 Pa, but does not exceed 10 Pa.

According to a fifth aspect of the present invention, there is provided a metal thin film manufactured by any one of the above-described methods.

According to a sixth aspect of the present invention, there is provided a dielectric capacitor, comprising:

a substrate;

a first electrode provided on the substrate and including any one of the above-described metal thin films;

a dielectric film provided on the first electrode; and a second electrode provided on the dielectric film.

According to a seventh aspect of the present invention, there is provided a method of manufacturing a dielectric capacitor, the method comprising:

depositing any one of the above-described metal thin films to form a first electrode;

forming a dielectric film on the first electrode; and forming a second electrode on the dielectric film, wherein the dielectric film is formed by physical vapor deposition, chemical vapor deposition, or spin coating.

According to an eighth aspect of the present invention, there is provided a dielectric capacitor manufactured by the above-described method.

According to a ninth aspect of the present invention, there is provided a semiconductor device comprising any one of the above-described dielectric capacitors.

DETAILED DESCRIPTION OF THE EMBODIMENTS

Figure 1A:
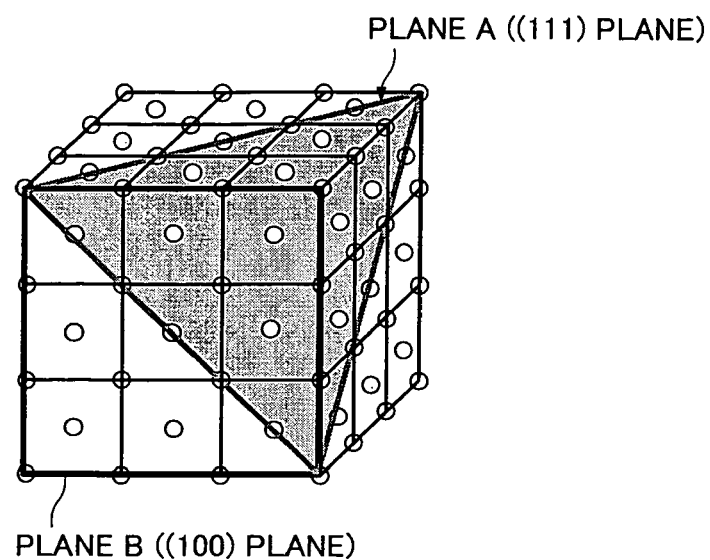
FIGS. 1A and 1B are illustrative of the crystal structure of a metal thin film according to one embodiment of the invention.

The invention may provide a novel metal thin film which can be suitably used as an electrode which makes up a ferroelectric capacitor, and a method of manufacturing the same.

The invention may also provide a dielectric capacitor with an improved remanent polarization, and a method of manufacturing the same.

The invention may further provide a semiconductor device to which the dielectric capacitor of the invention is applied.

According to one embodiment of the invention, there is provided a metal thin film provided on a substrate and having a metal with a face-centered cubic crystal structure,
   wherein the metal thin film is preferentially oriented in a (111) plane; and
   wherein a (100) plane which is not parallel to a surface of the substrate is present on a surface of the thin film.

According to the metal thin film of this embodiment, a novel metal thin film can be provided. This metal thin film can be suitably used as a lower electrode of a dielectric capacitor as described later.

In this embodiment, the term "preferential orientation" means a state in which the diffraction peak intensity from the (111) plane is greater than the diffraction peaks from other crystal planes in a θ-2θ scan of an X-ray diffraction method. In this embodiment, the statement "specific layer B (hereinafter called "layer B") provided on a specific layer A (hereinafter called "layer A")" includes the case where the layer B is directly provided on the layer A and the case where the layer B is provided on the layer A through another layer.

This metal thin film has following features.
   (A) The metal with a face-centered cubic crystal structure may include at least one element selected from the group consisting of Pt, Ir, and Ru.
   (B) An arithmetic average roughness (Ra) of the surface of the metal thin film may be equal to or more than 1.5 nm, but may not exceed 5 nm.

According to these features, in the case of applying the metal thin film of this embodiment to a lower electrode of a dielectric capacitor, a dielectric film with a desired orientation can be formed on the lower electrode. In this embodiment, the arithmetic average roughness is a value based on JIS B 0601.

According to one embodiment of the invention, there is provided a first method of manufacturing a metal thin film using physical vapor deposition, the method comprising:
   depositing the metal thin film by applying a voltage of 400 V or less.

This first method of manufacturing a metal thin film has following features.
   (A) In the first method of manufacturing a metal thin film, a deposition rate may be equal to or more than 0.5 Å/sec, but may not exceed 5 Å/sec.
   (B) In the first method of manufacturing a metal thin film, a degree of vacuum during deposition may be equal to or more than 0.8 Pa, but may not exceed 10 Pa.

According to one embodiment of the invention, there is provided a second method of manufacturing a metal thin film using physical vapor deposition,
   wherein a deposition rate is equal to or more than 0.5 Å/sec, but does not exceed 5 Å/sec.

In the second method of manufacturing a metal thin film, a degree of vacuum during deposition may be equal to or more than 0.8 Pa, but does not exceed 10 Pa.

According to one embodiment of the invention, there is provided a third method of manufacturing a metal thin film using physical vapor deposition,
   wherein a degree of vacuum during deposition is equal to or more than 0.8 Pa, but does not exceed 10 Pa.

According to the first to third methods of manufacturing a metal thin film, a metal thin film having a desired orientation and having unevenness on the surface can be obtained.

According to one embodiment of the invention, there is provided a dielectric capacitor, comprising:
   a substrate;
   a first electrode provided on the substrate and including the above-described metal thin film;
   a dielectric film provided on the first electrode; and
   a second electrode provided on the dielectric film.

In the dielectric capacitor, the dielectric film is formed on the metal thin film with a desired orientation. Therefore, the dielectric film and the metal thin film can be favorably lattice-matched at the contact surface between the dielectric film and the metal thin film depending on each material. As a result, a dielectric capacitor in which the orientation of the dielectric film is controlled can be provided. The details will be described in the following sections.

This dielectric capacitor has following features.

(A) The dielectric film may have a perovskite crystal structure and may be preferentially oriented in the (111) plane.

(B) The (100) plane present on a surface of the first electrode and a (001) plane of the dielectric film may be lattice-matched.

(C) The dielectric film may be shown by a general formula $ABO_3$; the A element may include at least Pb; the B element may include at least one of Zr, Ti, V, W, Nb, Mn, Fe, and Hf. Moreover, the A element may contain La, Sr, Ca, Bi, Ba, etc.

According to one embodiment of the invention, there is provided a method of manufacturing a dielectric capacitor, the method comprising:

depositing the above-described metal thin film, to form a first electrode;

forming a dielectric film on the first electrode; and forming a second electrode on the dielectric film, wherein the dielectric film is formed by physical vapor deposition, chemical vapor deposition, or spin coating.

This method of manufacturing a dielectric capacitor enables to manufacture a dielectric capacitor including the first electrode with a desired orientation.

The dielectric capacitor may be applied to a semiconductor device such as a ferroelectric memory.

These embodiments of the invention will be described below.

1. Metal Thin Film 1.1 Metal Thin Film

A metal thin film according to this embodiment is a thin film including a metal having a face-centered cubic crystal structure. As an example of such a metal, a metal including at least one of Pt, Ir, and Ru can be given. This metal thin film is preferentially oriented in the (111) plane, and the (100) plane which is not parallel to the surface of a substrate is present on the surface. The term "preferential orientation" used herein means a state in which the diffraction peak intensity from the (111) plane is greater than the diffraction peaks from other crystal planes in a θ-2θ scan of an X-ray diffraction method. The (100) plane is present on the surface of the metal thin film of this embodiment. Therefore, the metal thin film according to this embodiment has unevenness on the surface. This feature is further described below with reference to FIGS. 1A and 1B.

Figure 1B:
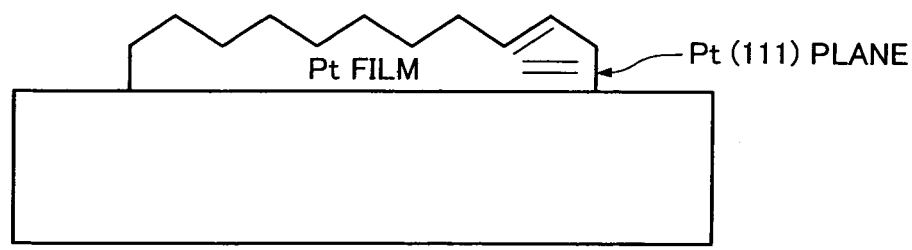

FIG. 1A is a diagram showing a unit cell of a face-centered cubic crystal structure. In this unit cell, the (111) plane is a plane A shown in FIG. 1A. Since the metal thin film according to this embodiment is preferentially oriented in the (111) plane, the metal thin film has a crystal structure in which the plane A is parallel to the surface of the substrate. The (100) plane present on the surface of the metal thin film is a plane B shown in FIG. 1. Specifically, as shown in FIG. 1B, in the case where the metal thin film is preferentially oriented in the plane A ((111) plane) and the crystal lattice is maintained, the plane B ((100) plane) does not become parallel to the surface of the substrate. As a result, unevenness geometrically occurs on the surface of the metal thin film.

As describe above, the metal thin film according to this embodiment has unevenness on the surface. It is preferable that the arithmetic average roughness (Ra) of the surface of the metal thin film be 1.5 nm or more, but 5 nm or less. The advantage in the case where the arithmetic average roughness of the metal thin film according to this embodiment is within the above range is described later in the section dealing with the dielectric capacitor.

According to this embodiment, a novel metal thin film which can be suitably used as a lower electrode of a dielectric capacitor can be provided.

1.2 Metal Thin Film Manufacturing Method

A method of manufacturing a metal thin film according to one embodiment of the invention is described below.

A given substrate is provided. As examples of the substrate, a semiconductor substrate such as a single element semiconductor such as silicon or germanium or a compound semiconductor such as GaAs or ZnSe, a metal substrate such as Pt, a sapphire substrate, and an insulating substrate such as MgO, $SrTiO_3$, $BaTiO_3$, or glass can be given. In the case of forming a dielectric capacitor as described later, the substrate is selected depending on the application of the dielectric film. In the case where the dielectric film is applied to a semiconductor device, a silicon substrate, preferably a silicon single crystal substrate, is used as the substrate.

A metal thin film is formed on the substrate using a physical vapor deposition (PVD) method. In this case, the metal thin film is formed while controlling the migration energy of the metal atoms on the surface of the substrate within a desired range by controlling the kinetic energy of the sputtered metal atoms. As examples of techniques for controlling the kinetic energy, the following can be given.

As a technique 1, you can adjust the applied voltage during sputtering to be equal to or less than 400 V, or preferably equal to or more than 300 V but not to exceed 400 V. The kinetic energy can be reduced when the applied voltage is 400 V or less, whereby the migration energy can be appropriately adjusted. This enables the crystal to be slowly grown, whereby a metal thin film having a desired crystal structure can be formed. Since sputtering discharge may become unstable if the applied voltage is less than 300 V, the applied voltage is preferably 300 V or more.

As a technique 2, you can adjust the degree of vacuum during deposition to be equal to or more than 0.8 Pa, but not to exceed 10 Pa. If the degree of vacuum is less than 0.8 Pa, a metal thin film of which the surface has an arithmetic average roughness of 1.5 nm or more, but 5 nm or less cannot be formed. This is because, since the migration energy is increased due to an increase in the kinetic energy, crystallization occurs in an orientation more stable than that of a desired crystal structure. If the degree of vacuum is more than 10 Pa, sputtering discharge may become unstable.

As a technique 3, the metal thin film is deposited under such conditions that the deposition rate of the metal thin film is equal to or more than 0.5 Å/sec, but does not exceed 5.0 Å/sec, and preferably equal to ore more than 1.0 Å/sec, but does not exceed 5.0 Å/sec. If the deposition rate is less than 0.5 Å/sec, the time required for deposition is significantly increased, whereby the manufacturing cost is increased. If the deposition rate exceeds 5.0 Å/sec, a metal thin film of which the surface has an arithmetic average roughness of 1.5 nm or more, but 5 nm or less cannot be formed. The deposition rate may be controlled by appropriately adjusting the distance between the target and the substrate in addition to utilizing the tecniques 1 and 2.

In the method of manufacturing the metal thin film according to this embodiment, the migration energy during metal thin film formation may be controlled within a desired range by controlling the kinetic energy using at least one of the techniques 1 to 3.

According to the method of manufacturing the metal thin film according to this embodiment, a novel metal thin film described in the section 1.1 can be formed.

2. Dielectric Capacitor and its Manufacturing Method

Figure 2:
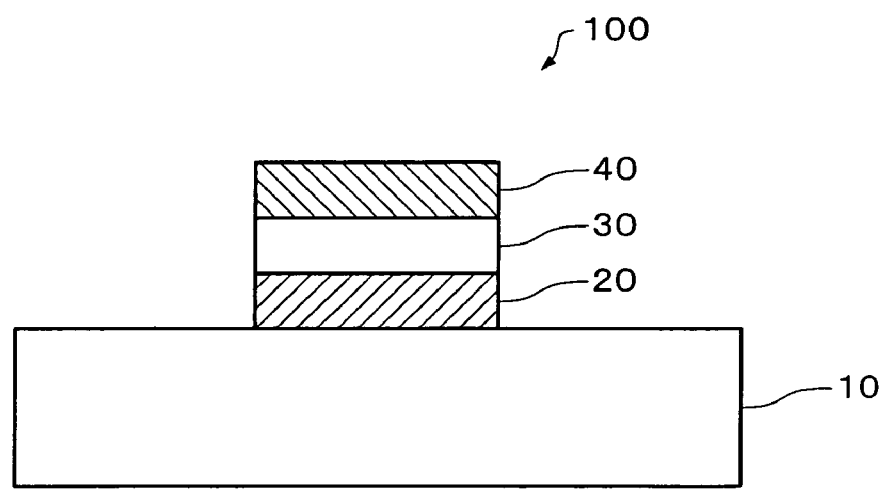
FIG. 2 is illustrative of a dielectric capacitor according to one embodiment of the invention.

A dielectric capacitor and a method of manufacturing the same according to this embodiment are described below with reference to FIG. 2. FIG. 2 is a cross-sectional diagram schematically showing a dielectric capacitor according to this embodiment. As shown in FIG. 2, a capacitor 100 includes a first electrode 20, a dielectric film 30, and a second electrode 40 provided on a substrate 10. The above-mentioned material may be used for the substrate 10. Each member which makes up the capacitor 100 is described later along with the manufacturing method.

The first electrode 20 is described below. As the first electrode 20, a metal having a face-centered cubic crystal structure may be used. For example, a metal film selected from the group consisting of Pt, Ir, and Ru, or an alloy of two or more metals selected from the group consisting of Pt, Ir, and Ru may be used. The first electrode 20 is the metal thin film described in the section 1, which is preferentially oriented in the (111) plane and in which the (100) plane which is not parallel to the surface of the substrate 10 is present on the surface. The first electrode 20 may be formed by using the formation method described in the section 1.2.

It is preferable that the arithmetic average roughness of the surface of the first electrode 20 be 1.5 nm or more, but 5 nm or less. An arithmetic average roughness of less than 1.5 nm means that a film in which the (100) plane which is not parallel to the surface of the substrate 10 is sufficiently present on the surface of the first electrode 20 is not obtained. Therefore, the dielectric film 30 having a desired orientation cannot be formed when forming the dielectric film 30 as described later. if the arithmetic average roughness exceeds 5 nm, the protrusion of the first electrode 20 may come in contact with the second electrode 40 depending on the thickness of the dielectric film 30, whereby a leakage current may be increased.

The dielectric film 30 is described below. It is preferable that the dielectric film 30 be an oxide having a perovskite crystal structure. In particular, a dielectric compound shown by a general formula $ABO_3$, in which the A element includes at least Pb, the B element includes at least one of Zr, Ti, V, W, Nb, Mn, Fe, and Hf. Moreover, the A element may contain La, Sr, Ca, Bi, Ba, etc. The dielectric film 30 may be preferentially oriented in the (111) plane in order to allow the dielectric film 30 to exhibit excellent polarization characteristics.

The second electrode 40 is described below. As the material for the second electrode 40, a noble metal such as Pt or Ir, or an oxide of such a noble metal ($IrO_x$, for example) may be used. The second electrode 40 may be a single layer of the above-mentioned material, or may have a multilayer structure in which layers of different materials are stacked. As the deposition method for the second electrode 40, a known method such as a sputtering method, a vacuum deposition method, or CVD may be used.

The dielectric capacitor according to this embodiment may be manufactured by the above-described steps.

The dielectric capacitor and the method of manufacturing the same enables provision of a dielectric capacitor 100 exhibiting excellent hysteresis characteristics. The reason therefor is considered to be that the dielectric film 30 is strongly and preferentially oriented in the (111) plane. In the dielectric capacitor 100 according to this embodiment, it is considered that the dielectric film 30 can be strongly and preferentially oriented in the (111) plane due to the crystal structure of the first electrode 20. This consideration is described below with reference to FIGS. 3A and 3B taking the case of applying a PZT film as the dielectric film 30.

Figure 3A:
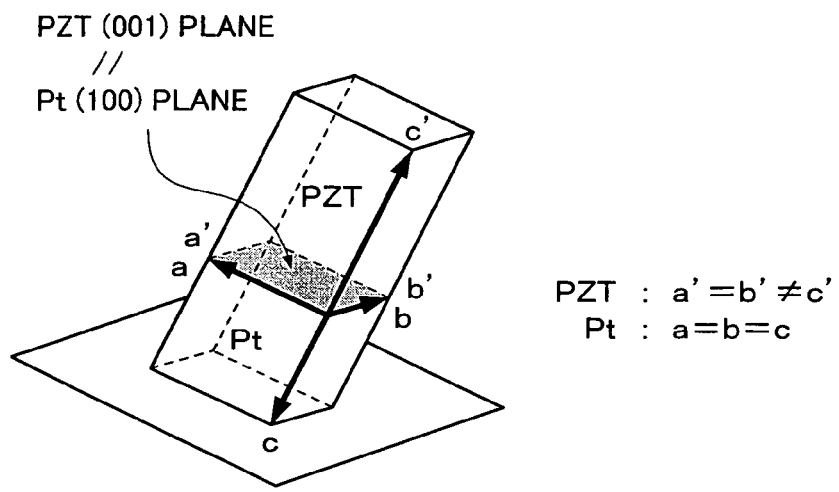
FIGS. 3A and 3B are illustrative of a dielectric capacitor according to one embodiment of the invention.
Figure 3B:
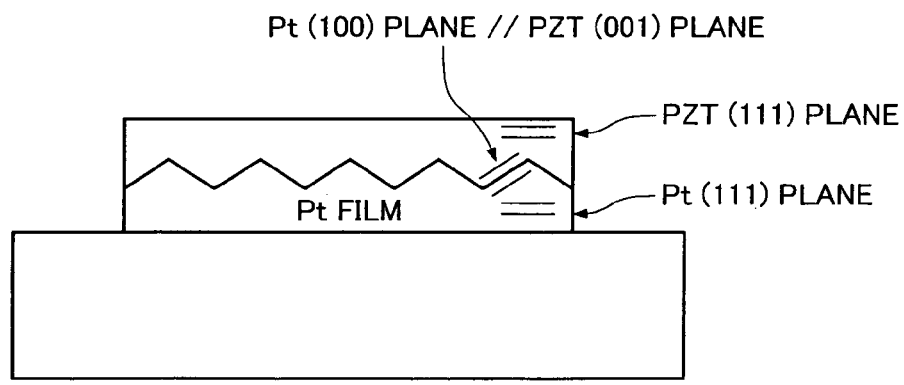

As described in the section of the metal thin film, since the first electrode 20 is preferentially oriented in the (111) plane and the (100) plane which is not parallel to the surface of the substrate 10 is present on the surface, the first electrode 20 has unevenness on the surface. FIG. 3A is an enlarged diagram showing the boundary between the first electrode 20 and the dielectric film 30. As shown in FIG. 3A, the crystal system of the first electrode 20 is face-centered cubic, and three sides of the crystal lattice have the same length (a=b=c). In the PZT film having a tetragonal crystal structure, three sides of the crystal lattice do not have the same length and have the relationship indicated as "a=b≠c". In the dielectric capacitor 100 according to this embodiment, the PZT film can be crystallized so that the (100) plane exposed on the surface of the first electrode 20 and the (001) plane of the PZT film are lattice-matched. As a result, as shown in FIG. 3B, the PZT film shows the (111) plane preferential orientation from the geometrical relationship between the first electrode 20 and the PZT film.

The dielectric film 30 preferentially oriented in the (111) plane can also be formed when the PZT film is rhombohedral instead of tetragonal. As described above, according to the dielectric capacitor of this embodiment, the dielectric film 30 preferentially oriented in the (111) plane can be formed, whereby the capacitor 100 exhibiting excellent hysteresis characteristics can be provided.

3. Examples

3.1. Formation of Capacitor

Some examples of the dielectric capacitor according to one embodiment of the invention is described below with reference to FIG. 4.

(a) Formation of First Electrode 20

Figure 4:
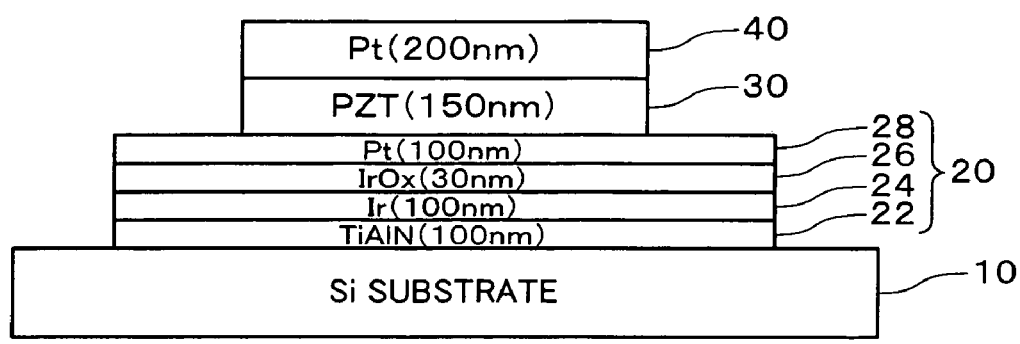
FIG. 4 is a cross-sectional diagram schematically showing an example of a dielectric capacitor according to one embodiment of the invention.

As shown in FIG. 4, a silicon substrate was provided as the substrate 10. A TiAlN film 22 with a thickness of 100 nm, an Ir film 24 with a thickness of 100 nm and an $IrO_x$ film 26 with a thickness of 30 nm were stacked on the substrate 10 in that order. These films were formed by using a sputtering method. A Pt film 28 with a thickness of 100 nm was formed on the $IrO_x$ film 26 to form the first electrode 20 in which four types of films were stacked. The formation conditions for each film are described below.

The TiAlN film 22 was deposited from a Ti—Al alloy target (composition: Ti: 60 at %, Al: 40 at %) in a mixed gas atmosphere of argon (Ar) and nitrogen ($N_2$) using a DC magnetron sputtering method at a substrate temperature of 400° C.

The Ir film 24 was deposited from an Ir target in an Ar atmosphere using a DC magnetron sputtering method. The substrate temperature was 250° C.

The $IrO_x$ film 26 was deposited subsequent to the Ir film from an Ir target in a mixed gas atmosphere of Ar and oxygen ($O_2$) using a DC magnetron sputtering method. The substrate temperature was 250° C.

The deposition conditions for the Pt film 28 were as shown in Table 1. Note that Examples 1 to 10 with different deposition conditions for the Pt film 28, and Comparative Example 11 were formed.

TABLE 1

| No. | Discharge voltage (V) | Deposition rate (Å/sec) | Process pressure (Pa) | Deposition temperature (° C.) | Ra of lower electrode (nm) | Remanent polarization (µC/cm$^2$) | Result |
| --- | --- | --- | --- | --- | --- | --- | --- |
| 1 | 320 | 1.2 | 0.25 | 200 | 1.8 | 14.5 | Good |
| 2 | 342 | 2.5 | 0.25 | 200 | 1.7 | 13.1 | Good |
| 3 | 396 | 3.6 | 0.25 | 200 | 1.5 | 13.0 | Good |
| 4 | 434 | 7.4 | 0.76 | 200 | 1.3 | 10.2 | Fair |
| 5 | 436 | 9.2 | 1.1 | 200 | 1.6 | 11.5 | Good |
| 6 | 435 | 12.3 | 3.0 | 200 | 1.8 | 11.9 | Good |
| 7 | 311 | 1.8 | 0.90 | 200 | 1.9 | 15.8 | Good |
| 8 | 313 | 2.5 | 2.8 | 200 | 2.0 | 15.5 | Good |
| 9 | 311 | 2.9 | 4.8 | 200 | 2.3 | 15.4 | Good |
| 10 | 312 | 4.3 | 9.5 | 200 | 2.5 | 15.4 | Good |
| 11 | 435 | 6.0 | 0.25 | 250 | 1.1 | 8.1 | Bad |

(b) Formation of Dielectric Film 30

A PZT film (hereinafter indicated as "PZT film 30") was formed on the first electrode 20 as the dielectric film 30 for each of Examples 1 to 10 and Comparative Example 11 formed in step (a). The PZT film 30 was crystallized by repeating coating/drying of a PZT sol-gel solution three times using a spin coating method, and performing a rapid thermal annealing (RTA) treatment. The crystallization temperature was 600° C., the crystallization time was five minutes, and the atmosphere during the treatment was oxygen. The thickness of the PZT film after crystallization was 150 nm.

(c) Formation of Second Electrode 40

A Pt film with a thickness of 200 nm was deposited on the dielectric film 30 formed in step (b) as the second electrode 40 using a DC magnetron sputtering method. The deposition temperature was 250° C., the discharge voltage was 435 V, and the deposition rate was 6.0 Å/sec. The dielectric capacitor 100 as shown in FIG. 4 was then formed by using known photolithography and etching technology.

3.2 Evaluation

Figure 5:
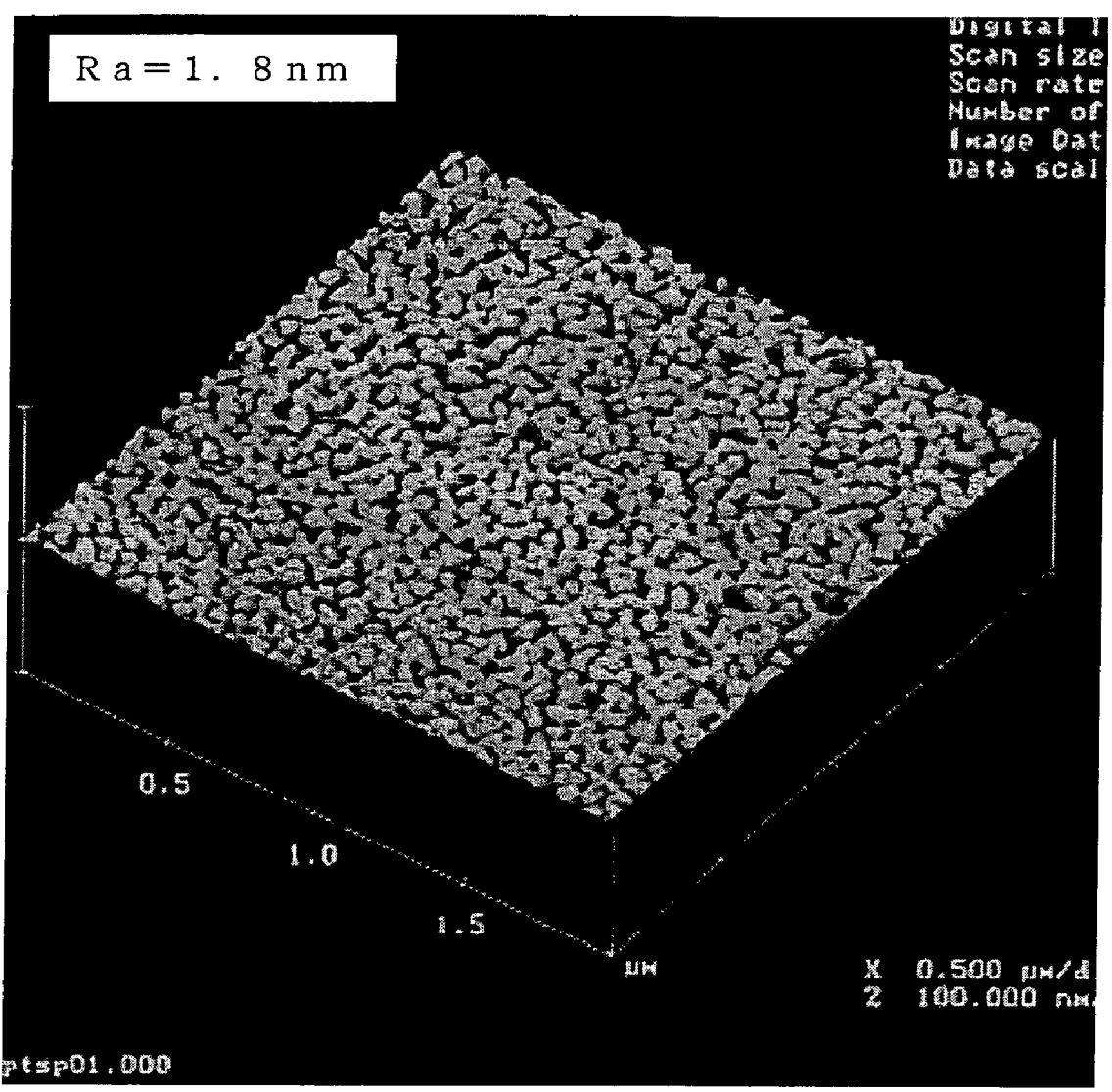
FIG. 5 is an AFM image showing a surface state of a first electrode 20 of Example 1 of the dielectric capacitor shown in FIG. 4.
Figure 6:
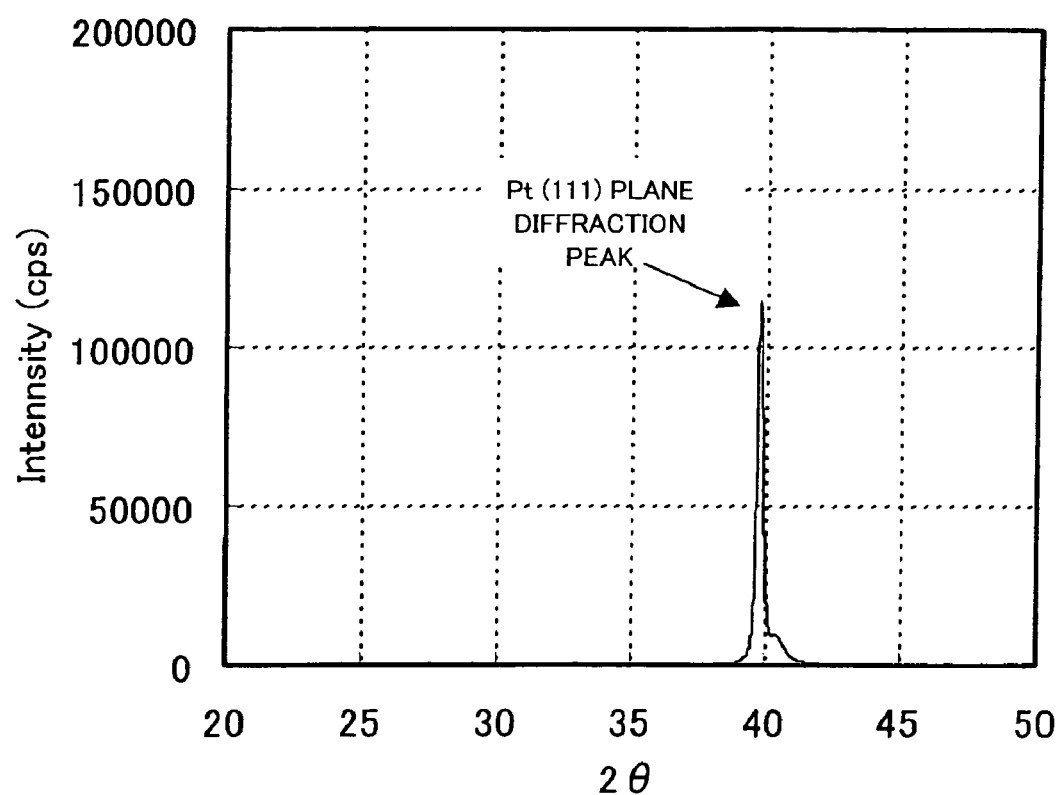
FIG. 6 shows an XRD diffraction pattern of the first electrode 20 of Example 1.

The surface shape of the first electrode 20 was examined using an atomic force microscope (AFM) after the completion of step (a). The AFM observation was conducted in a tapping measurement mode at a probe scan speed of 1 Hz and a horizontal resolution of nine bits. FIG. 5 shows the AFM image of the surface of the first electrode 20 of Example 1. The crystal structure and the orientation of the first electrode 20 were examined by using an X-ray diffraction (XRD) method. FIG. 6 shows the XRD pattern of the first electrode 20 of Example 1. For comparison, the AFM image of the surface of the first electrode 20 of Comparative Example 11 is shown in FIG. 7, and the XRD pattern of the first electrode 20 of Comparative Example 11 is shown in FIG. 8.

As is clear from FIG. 5, unevenness was formed on the surface of the Pt film 28 of the first electrode 20 of Example 1, and the arithmetic average roughness of the surface of this film was 1.8 nm. As is clear from FIG. 6, it was confirmed that the Pt film 28 of Example 1 was strongly oriented in the (111) plane.

Figure 7:
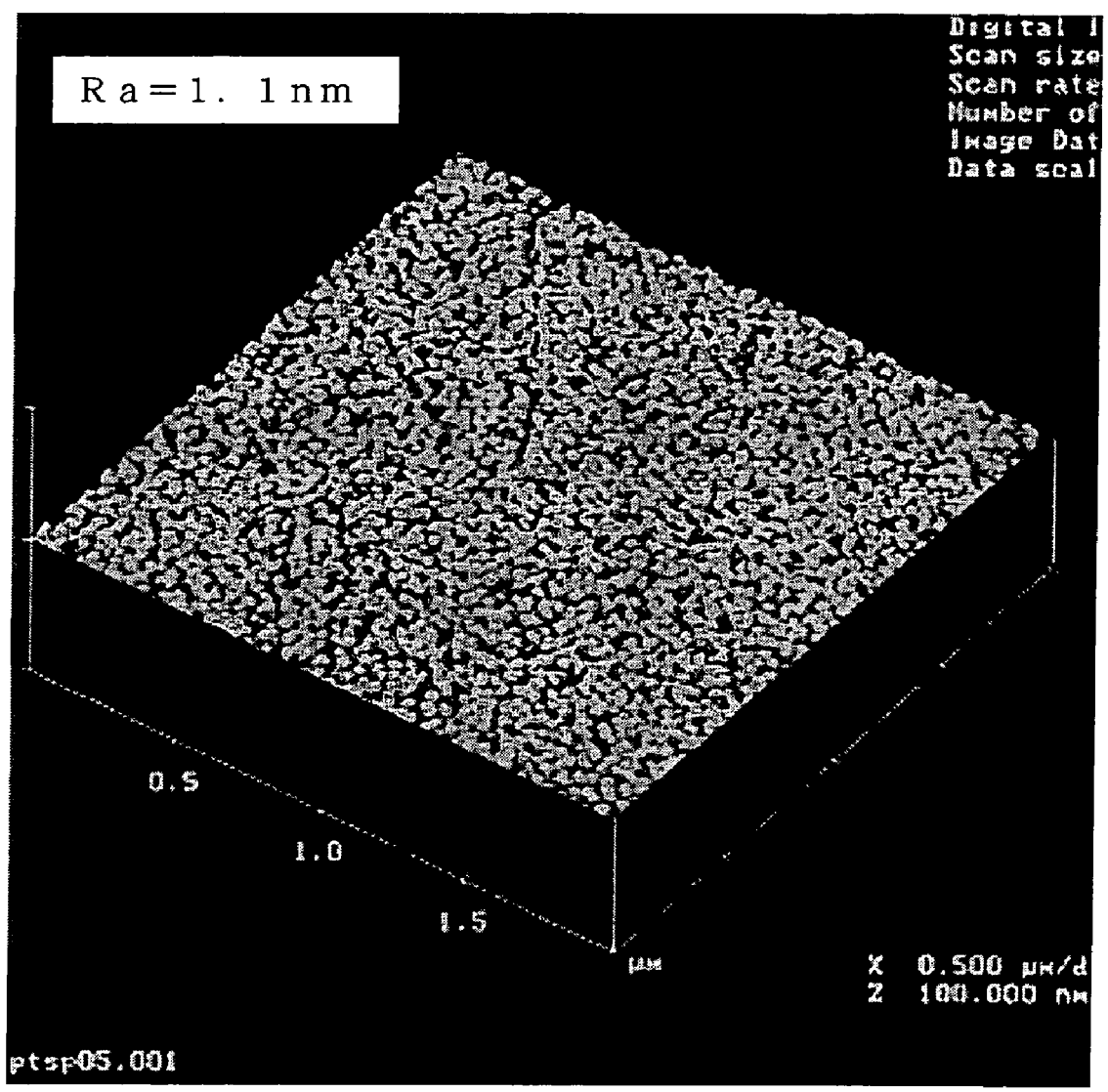
FIG. 7 is an AFM image showing a surface state of a first electrode 20 of Example 11 of the dielectric capacitor shown in FIG. 4.
Figure 8:
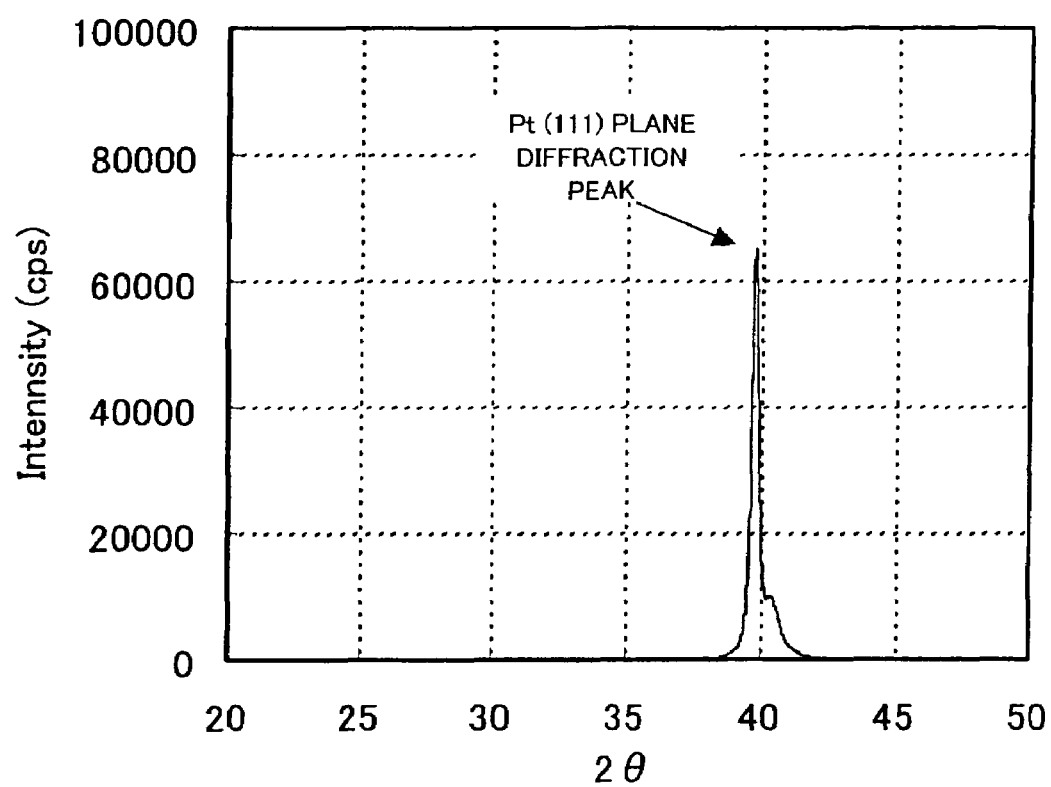
FIG. 8 shows an XRD diffraction pattern of the first electrode 20 of Example 11.

On the other hand, as is clear from the comparison between FIG. 5 and FIG. 7, unevenness on the surface of the Pt film 28 of the first electrode 20 of Comparative Example 11 was small, and the arithmetic average roughness Ra was 1.1 nm. As shown in FIG. 8, although the Pt film 28 was oriented in the (111) plane, the diffraction peak intensity from the (111) plane was smaller than that of the Pt film of Example 1, and it was confirmed that the degree of (111) plane orientation was small.

Figure 9:
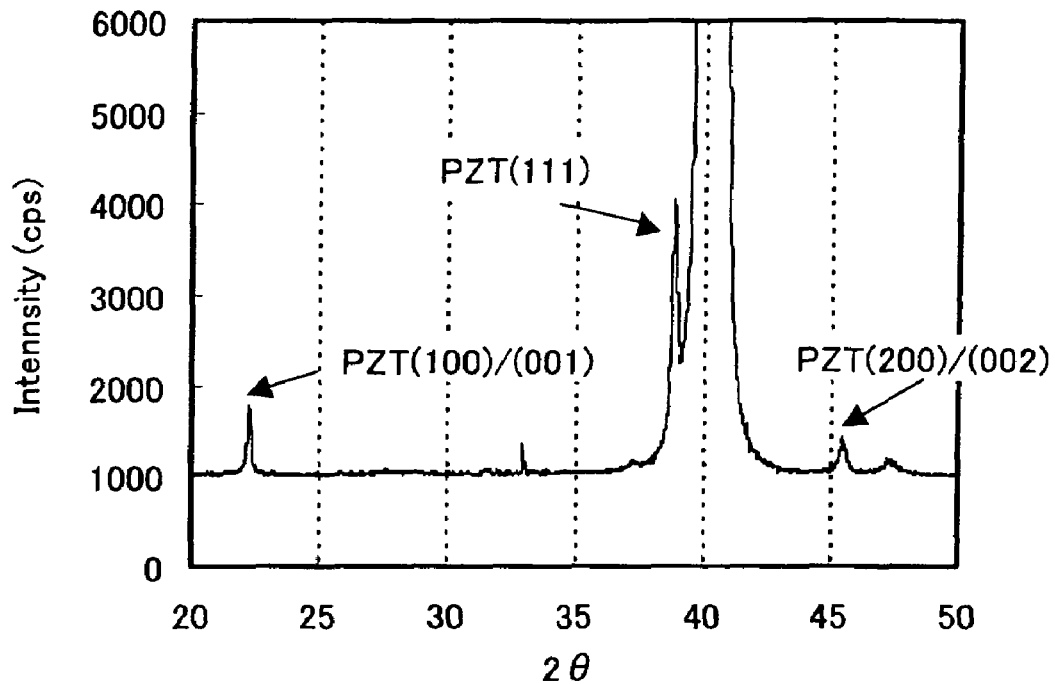
FIG. 9 shows an XRD diffraction pattern of a PZT film of Example 1.
Figure 10:
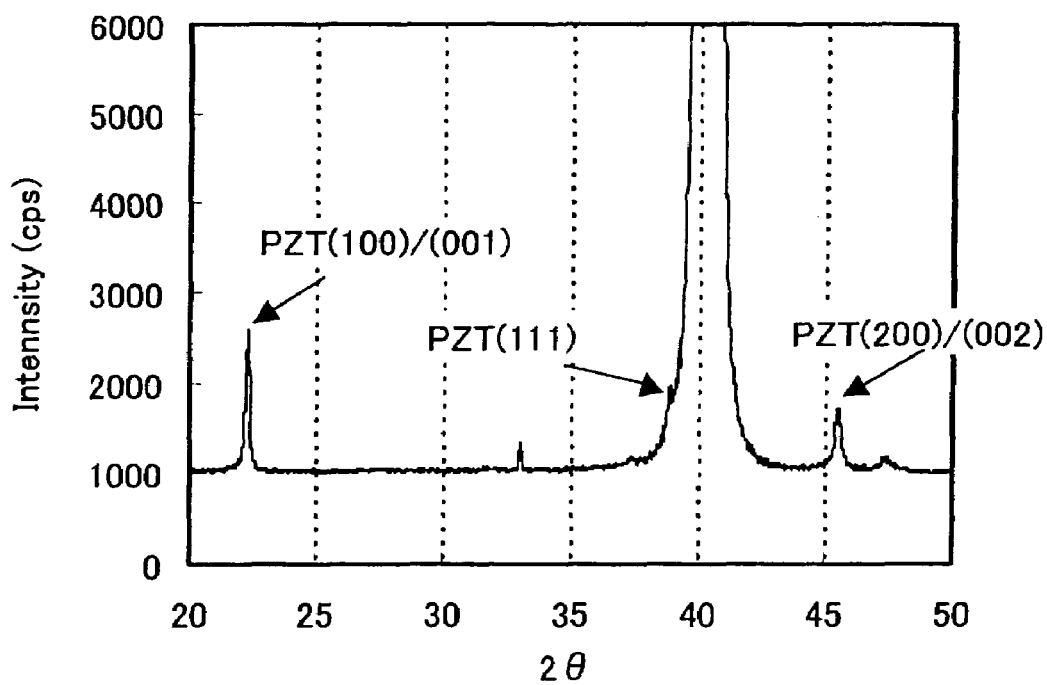
FIG. 10 shows an XRD diffraction pattern of a PZT film of Example 11.

The XRD pattern of the PZT film 30 of Example 1 at the completion of the step (b) is shown in FIG. 9. The XRD pattern of the PZT film 30 of Comparative Example 11 is shown in FIG. 10. As shown in FIG. 9, it was confirmed that the PZT film 30 of Example 1 had a perovskite structure and was strongly oriented in the (111) plane. On the other hand, as shown in FIG. 10, it was confirmed that the peak indicating the (111) plane orientation was very small in the PZT film of Comparative Example 11. From these results, it was found that, when the first electrode 20 is oriented in the (111) plane and the arithmetic average roughness Ra is within a desired range, the PZT film 30 formed on the first electrode 20 shows a strong (111) plane orientation.

Figure 11:
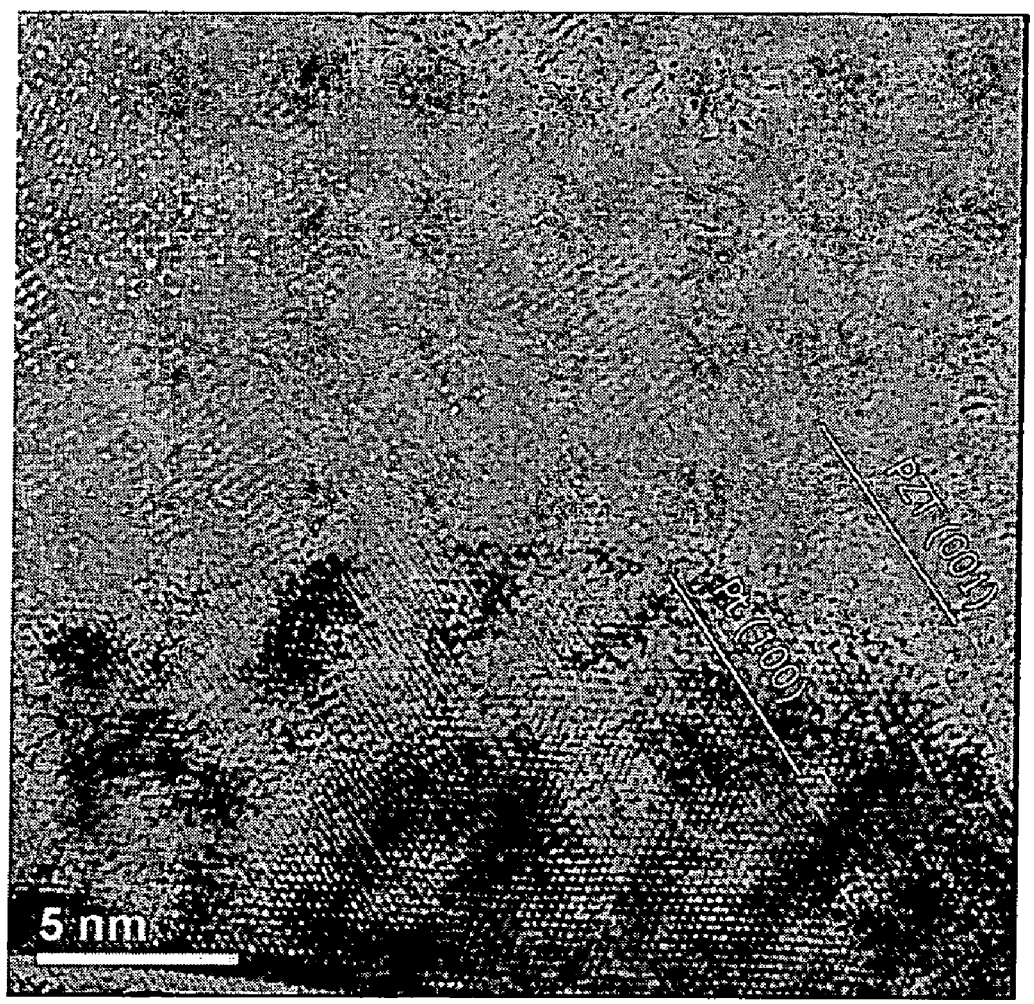
FIG. 11 shows an atomic arrangement at the interface between a Pt film 28 and the PZT film 30 of Example 1.

The atomic arrangement of Example 1 at the interface between the first electrode 20 and the PZT film 30 was observed using an electron microscope. The results are shown in FIG. 11. As is clear from FIG. 11, it was confirmed that the (100) plane of the Pt film 28 and the (001) plane of the PZT film 30 were lattice-matched. Therefore, the PZT film 30 in these examples can be strongly and preferentially oriented in the (111) plane in a geometrical sense. As described above, the metal thin film of the invention has unevenness on the surface since the metal thin film is preferentially oriented in the (111) plane and the (100) plane which is not parallel to the surface of the substrate 10 is present on the surface. The dielectric film of the dielectric capacitor in these examples is a film having a perovskite crystal structure and preferentially oriented in the (111) plane. The (100) plane present on the surface of the electrode and the (001) plane of the dielectric film are lattice-matched.

Figure 12:
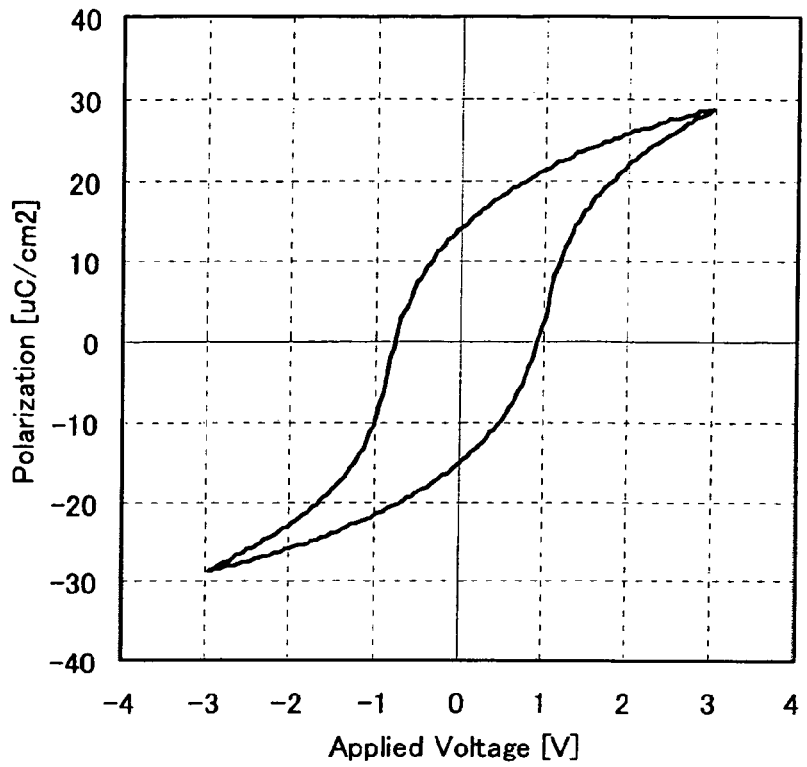
FIG. 12 shows hysteresis characteristics of the dielectric capacitor of Example 1.
Figure 13:
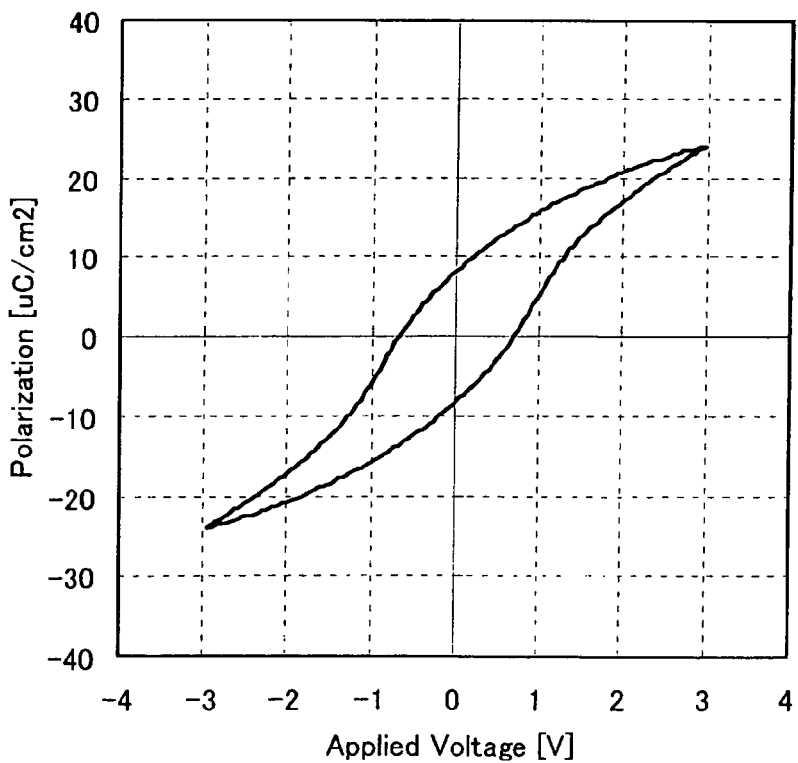
FIG. 13 shows hysteresis characteristics of the dielectric capacitor of Example 11.

The hysteresis curve of the dielectric capacitor of Example 1 is shown in FIG. 12. The hysteresis curve of the dielectric capacitor of Comparative Example 11 is shown in FIG. 13. As is clear from the comparison between FIG. 12 and FIG. 13, the dielectric capacitor of Example 1 had a remanent polarization (Pr) of 14.5 µC/cm$^2$ and the dielectric capacitor of Comparative Example 11 had a remanent polarization of 8.1 µC/cm$^2$ at an applied voltage of 3 V. Therefore, it was confirmed that the dielectric capacitor according to the example had a large remanent polarization in comparison with the dielectric capacitor according to the comparative example.

As described above, the crystal orientation of the PZT film can be improved by using the metal thin film according to this embodiment as the lower electrode of the dielectric capacitor. As a result, a dielectric capacitor exhibiting a large remanent polarization can be obtained.

4. Application 4.1 First Application Example

A semiconductor device including the dielectric capacitor according to one embodiment of the invention is described below. In this embodiment, a ferroelectric memory device including the dielectric capacitor is described as an example.

Figure 14A:
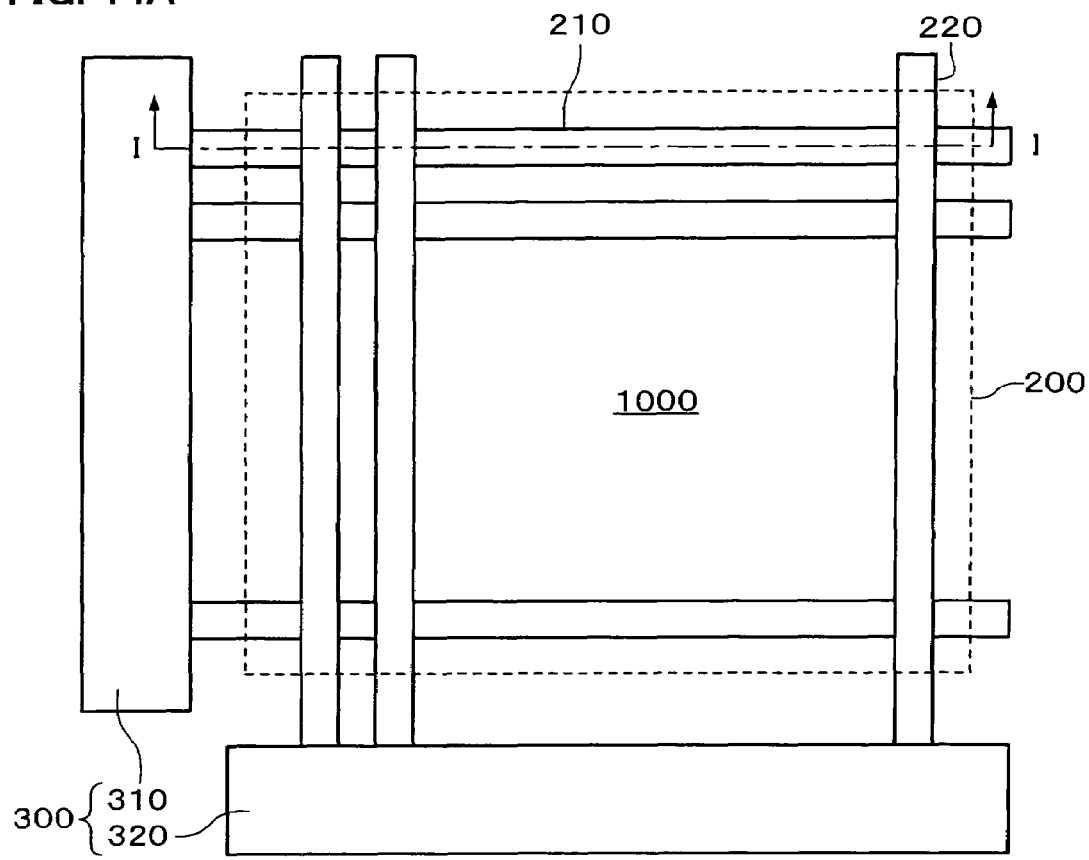
FIGS. 14A and 14B show a ferroelectric memory according to one embodiment of the invention.
Figure 14B:
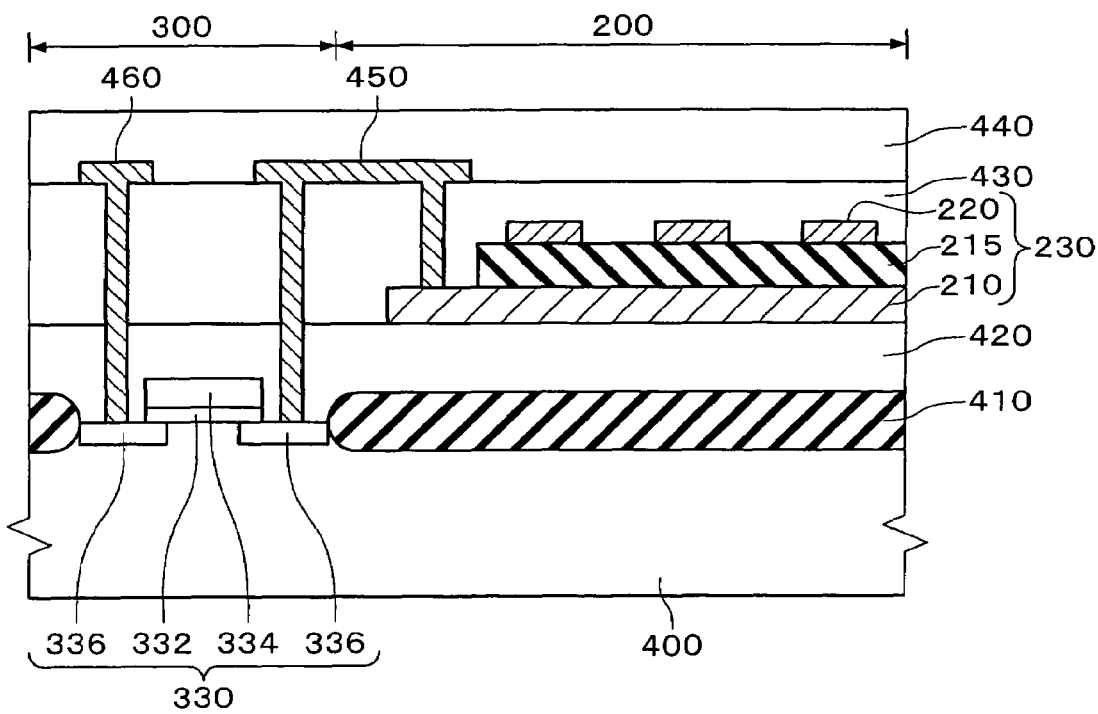

FIGS. 14A and 14B are diagrams schematically showing a ferroelectric memory device 1000 using the dielectric capacitor according to this embodiment. FIG. 14A shows a planar shape of the ferroelectric memory device 1000, and FIG. 14B shows the cross section along the line I-I shown in FIG. 14A.

As shown in FIG. 14A, the ferroelectric memory device 1000 includes a memory cell array 200 and a peripheral circuit section 300. The memory cell array 200 and the peripheral circuit section 300 are formed in different layers. The peripheral circuit section 300 is disposed on a semiconductor substrate 400 in a region differing from the memory cell array 200. As specific examples of the peripheral circuit section 300, a Y gate, sense amplifier, input-output buffer, X address decoder, Y address decoder, or address buffer can be given.

In the memory cell array 200, lower electrodes 210 (wordlines) for selecting rows and upper electrodes 220 (bitlines) for selecting columns are arranged to intersect. The lower electrodes 210 and the upper electrodes 220 are in the shape of stripes formed by a plurality of linear signal electrodes. The signal electrodes may be formed so that the lower electrodes 210 are bitlines and the upper electrodes 220 are wordlines.

As shown in FIG. 14B, a dielectric film 215 is disposed between the lower electrode 210 and the upper electrode 220. In the memory cell array 200, a memory cell which functions as a dielectric capacitor 230 is formed in the region in which the lower electrode 210 intersects the upper electrode 220. It suffices that the dielectric film 215 be disposed between the lower electrode 210 and the upper electrode 220 at least in the region in which the lower electrode 210 intersects the upper electrode 220.

In the ferroelectric memory device 1000, a second interlayer dielectric 430 is formed to cover the lower electrode 210, the dielectric film 215, and the upper electrode 220. An insulating protective layer 440 is formed on the second interlayer dielectric 430 so as to cover interconnect layers 450 and 460.

As shown in FIG. 14A, the peripheral circuit section 300 includes various circuits for selectively writing or reading information into or from the memory cell array 200. For example, the peripheral circuit section 300 includes a first driver circuit 310 for selectively controlling the lower electrode 210, a second driver circuit 320 for selectively controlling the upper electrode 220, and a signal detection circuit (not shown) such as a sense amplifier.

As shown in FIG. 14B, the peripheral circuit section 300 includes a MOS transistor 330 formed on the semiconductor substrate 400. The MOS transistor 330 includes a gate insulating film 332, a gate electrode 334, and source/drain regions 336. The MOS transistors 330 are isolated by an element isolation region 410. A first interlayer dielectric 420 is formed on the semiconductor substrate 400 on which the MOS transistor 330 is formed. The peripheral circuit section 300 is electrically connected with the memory cell array 200 through an interconnect layer 51.

An example of write and read operations of the ferroelectric memory device 1000 is described below.

In the read operation, a read voltage is applied to the capacitor of the selected memory cell. This also serves as a write operation of "0". At this time, a current flowing through the selected bitline or a potential when causing the bitline to be in a high impedance state is read by using the sense amplifier. A predetermined voltage is applied to the capacitors of the unselected memory cells in order to prevent occurrence of crosstalk during reading.

In the write operation of "1", a write voltage which causes polarization reversal is applied to the capacitor of the selected memory cell. In the write operation of "0", a write voltage which does not cause polarization reversal is applied to the capacitor of the selected memory cell, whereby the "0" state written during the read operation is maintained. A predetermined voltage is applied to the capacitors of the unselected memory cells in order to prevent occurrence of crosstalk during writing.

In the ferroelectric memory device 1000, since the metal thin film with a desired orientation is used as the lower electrode 210, the dielectric capacitor 230 includes the PZT dielectric film 215 strongly oriented in the (111) plane.

Therefore, the dielectric capacitor 230 is provided with excellent hysteresis characteristics, whereby a highly reliable ferroelectric memory device 1000 can be provided.

4.2 Second Application Example

Figure 15A:
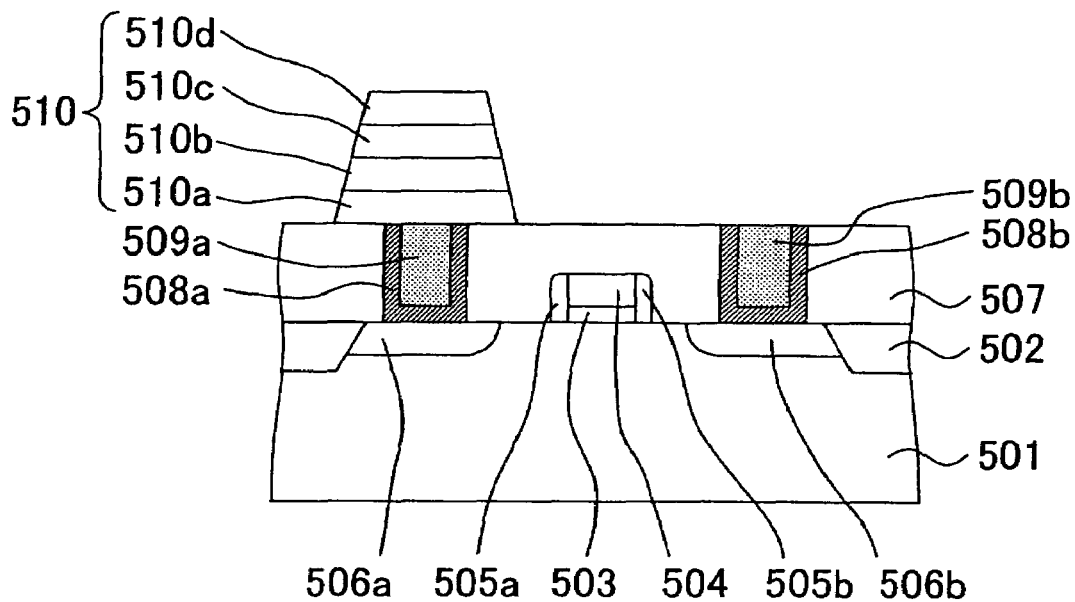
FIGS. 15A and 15B show another ferroelectric memory according to one embodiment of the invention.
Figure 15B:
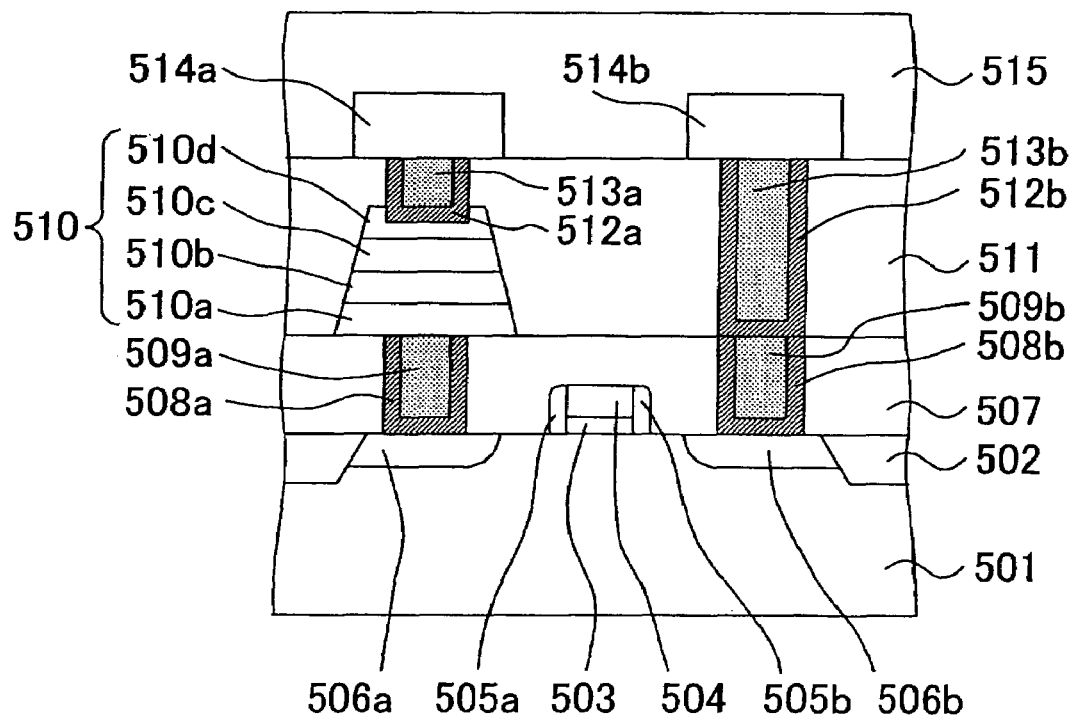

The manufacturing steps and the structure of another example of a semiconductor device including the dielectric capacitor according to this embodiment are described below with reference to FIGS. 15A and 15B. In this embodiment, a ferroelectric memory device including the dielectric capacitor is described as an example. FIGS. 15A and 15B is a cross-sectional view illustrative of a semiconductor device according to a second application example.

As shown in FIG. 15A, a MOS transistor is formed on a silicon substrate 501 which is a semiconductor layer. An example of this step is described below. An element isolation film 502 for defining an active region is formed in the silicon substrate 501. A gate oxide film 503 is formed on the defined active region. A gate electrode 504 is formed on the gate oxide film 503, sidewalls 505a and 505b are formed on the sidewalls of the gate electrode 504, and impurity regions 506a and 506b as a source and a drain are formed in the silicon substrate 501 located in the element region. A MOS transistor is formed on the silicon substrate 501 in this manner.

A first interlayer dielectric 507 containing silicon oxide as the major component is formed on the MOS transistor, and contact holes connected with the impurity regions 506a and 506b are formed in the first interlayer dielectric 507. The contact holes are filled with adhesive layers 508a and 508b and W-plugs 509a and 509b. A ferroelectric capacitor 510 connected with the W-plug 509a is formed on the first interlayer dielectric 507.

The ferroelectric capacitor 510 has a structure in which a lower electrode 510a, a ferroelectric layer 510b, an upper electrode 510c, and a protective film 510d are stacked in that order. The formation method for the ferroelectric capacitor 510 is as follows. As the lower electrode 510a, a TiAlN film (100 nm), an Ir film (50 nm), and an $IrO_x$ film (80 nm) are formed in that order by using a sputtering method, and a Pt film (100 nm) is formed by using the method of the invention. As the ferroelectric layer 510b, a PZT film is crystallized by repeating coating/drying of a PZT sol-gel solution three times using a spin coating method, and performing a rapid thermal annealing (RTA) treatment. The crystallization temperature is 600° C., the crystallization time is five minutes, and the atmosphere during the treatment is oxygen. The thickness of the PZT film after crystallization is 150 nm. A Pt film (50 nm) is formed as the upper electrode 510c. A heat treatment is then performed at 700° C. for one hour in an oxygen atmosphere, and an $IrO_x$ film (100 nm) and an Ir film (70 nm) are formed in that order as the protective film 510d. The ferroelectric capacitor 510 is then formed by using known photolithography and etching technology.

As shown in FIG. 15B, a second interlayer dielectric 511 containing silicon oxide as the major component is formed on the ferroelectric capacitor 510, and a via hole located on the ferroelectric capacitor 510 and a via hole located on the W-plug 509b are formed. The via holes are respectively filled with an adhesive layer 512a and a W-plug 513a connected with the ferroelectric capacitor 510 and an adhesive layer 512b and a W-plug 513b connected with the W-plug 509b. Al alloy interconnects 514a and 514b respectively connected with the W-plugs 513a and 513b are formed on the second interlayer dielectric 511. A passivation film 515 is formed on the second interlayer dielectric 511 and the Al alloy interconnects 514*a* and 514*b*.

In this ferroelectric memory device, since the metal thin film with a desired orientation is used as the lower electrode 510*a*, the dielectric capacitor 510 includes the PZT dielectric film 510*b* strongly oriented in the (111) plane. Therefore, the dielectric capacitor 510 is provided with excellent hysteresis characteristics, whereby a highly reliable ferroelectric memory device can be provided.

Although only some embodiments of the present invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A dielectric capacitor, comprising:

a substrate;

a first electrode provided on the substrate and including a metal thin film provided on the substrate and having a metal with a face-centered cubic crystal structure, wherein the metal thin film is preferentially oriented in a (111) plane;

wherein a (100) plane which is not parallel to a surface of the substrate is present on a surface of the thin film; and wherein an arithmetic average roughness (Ra) of the surface of the metal film is equal to or more than 1.5 nm, but does not exceed 5 nm;

a dielectric film provided on the first electrode; and a second electrode provided on the dielectric film.

2. The dielectric capacitor as defined in claim 1, wherein the dielectric film has a perovskite crystal structure and is preferentially oriented in the (111) plane.

3. The dielectric capacitor as defined in claim 1, wherein the (100) plane present on a surface of the first electrode and a (001) plane of the dielectric film are lattice-matched.

4. The dielectric capacitor as defined in claim 1, wherein:

the dielectric film is shown by a general formula $ABO_3$; and the A element includes Pb.

* * * * *